United States Patent
Song et al.

(10) Patent No.: US 9,514,798 B2
(45) Date of Patent: *Dec. 6, 2016

(54) ADDRESS STORAGE CIRCUIT AND MEMORY AND MEMORY SYSTEM INCLUDING THE SAME

(71) Applicant: SK hynix Inc., Gyeonggi-do (KR)

(72) Inventors: Choung Ki Song, Gyeonggi-do (KR); Ji Eun Jang, Gyeonggi-do (KR); Seok Cheol Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/297,311

(22) Filed: Jun. 5, 2014

(65) Prior Publication Data

US 2015/0162066 A1 Jun. 11, 2015

(30) Foreign Application Priority Data

Dec. 11, 2013 (KR) ........................ 10-2013-0154058

(51) Int. Cl.
*G11C 7/00* (2006.01)
*G11C 11/406* (2006.01)
*G11C 11/408* (2006.01)

(52) U.S. Cl.
CPC ............ *G11C 11/406* (2013.01); *G11C 11/408* (2013.01); *G11C 11/40611* (2013.01)

(58) Field of Classification Search
CPC . G11C 11/406; G11C 11/408; G11C 11/40611
USPC ................ 365/222, 233.12, 189.16, 189.011
See application file for complete search history.

(56) References Cited

U.S. PATENT DOCUMENTS

| | | | |
|---|---|---|---|
| 8,310,893 B2 | 11/2012 | Luthra et al. | |
| 2002/0001246 A1* | 1/2002 | Hidaka | ......................... 365/222 |
| 2004/0196719 A1* | 10/2004 | Aritomi et al. | ................ 365/222 |
| 2012/0327734 A1* | 12/2012 | Sato | .......................... G11C 5/14 365/226 |
| 2015/0162071 A1* | 6/2015 | Yoon | ................... G11C 11/4085 365/203 |

FOREIGN PATENT DOCUMENTS

| | | |
|---|---|---|
| KR | 1020120052565 | 5/2012 |
| KR | 1020120086951 | 8/2012 |
| KR | 1020130009591 | 1/2013 |
| KR | 1020150033949 | 4/2015 |

* cited by examiner

*Primary Examiner* — Tha-O H Bui
(74) *Attorney, Agent, or Firm* — IP & T Group LLP

(57) ABSTRACT

A memory including a plurality of word lines to which one or more memory cells are coupled, an address storage unit suitable for storing an input address corresponding to a first external signal that is inputted at a random time, and a control unit suitable for activating a word line corresponding to the input address of the plurality of word lines in response to an active command and refreshing one or more target word lines selected using an address stored in the address storage unit when performing a refresh operation.

27 Claims, 8 Drawing Sheets

ADDRESS STORAGE CIRCUIT AND MEMORY AND MEMORY SYSTEM INCLUDING THE SAME

CROSS-REFERENCE TO RELATED APPLICATION(S)

The present application claims priority of Korean Patent Application No. 10-2013-0154058, filed on Dec. 11, 2013, which is incorporated herein by reference in its entirety.

BACKGROUND

1. Field

Exemplary embodiments of the present invention relate to a semiconductor memory device, and more particularly, to a memory and a memory system including an address storage circuit.

2. Description of the Related Art

A memory cell of a memory includes a transistor configured to act as a switch and a capacitor configured to store a charge (data). The data is distinguished between 'High' (logic 1) and 'Low' (logic 0) depending on whether a charge is present in the capacitor, that is, whether the capacitor has a high terminal voltage.

In principle, the charge should remain in the capacitor and retention of data should not consume power. However, data may be lost because the initial charge stored in the capacitor is reduced due to the current leakage attributable to the PN junction of a MOS transistor. In order to prevent the loss of data, data within a memory cell is read before it is lost and the capacitor is recharged to a normal level based on the read information. This operation is periodically repeated in order to maintain the data. The process of recharging cells to retain data is called a refresh operation.

FIG. 1 is a diagram showing part of a cell array in order to describe a word line disturbance phenomenon. In FIG. 1, 'BL' denotes a bit line.

In FIG. 1, 'WLK−1', 'WLK', and 'WLK+1' denote word lines arranged in parallel in the cell array. The word line WLK indicated by 'HIGH_ACT' is a word line that has been activated a large number of times or has had a high frequency of activation, and the word lines WLK−1 and WLK+1 are adjacent to the word line WLK. 'CELL_K−1', 'CELL_K', and 'CELL_K+1' denote memory cells coupled to the respective word lines WLK−1, WLK, and WLK+1. The memory cells CELL_K−1, CELL_K, and CELL_K+1 include respective cell transistors TR_K−1, TR_K, and TR_K+1 and respective cell capacitors CAP_K−1, CAP_K, and CAP_K+1.

In FIG. 1, when the word line WLK becomes activated and precharged (or deactivated), voltages of the word lines WLK−1 and WLK+1 rise and fall attributable to a coupling phenomenon generated between the word line WLK and the word lines WLK−1 and WLK+1. The amount of charge stored in the cell capacitors CAP_K−1 and CAP_K+1 is influenced. Accordingly, if the word line WLK is greatly activated-precharged and thus the word line WLK oscillates between an active state and a precharge state, data stored in the memory cells CELL_K−1 and CELL_K+1 may be damaged or lost due to changes in the amount of charge stored in the cell capacitors CAP_K−1 and CAP_K+1.

Furthermore, due to an electromagnetic wave that is generated when a word line oscillates between an active state and a precharge state, electrons may move to and from a cell capacitor coupled to an adjacent word line and data stored in the memory cell may be damaged or lost.

SUMMARY

Various embodiments of the present invention are directed to providing a memory and a memory system in which addresses of activated word lines are randomly stored and adjacent word lines are refreshed, thereby preventing damage or loss of data stored in memory cells coupled to such word lines.

In an embodiment, a memory may include a plurality of word lines to which one or more memory cells are coupled, an address storage unit suitable for storing an input address corresponding to a first external signal that is received at a random time, and a control unit suitable for activating a word line corresponding to the input address of the plurality of word lines in response to an active command and refreshing one or more target word lines selected using an address stored in the address storage unit when performing a refresh operation.

The memory may further include an address counting unit suitable for generating a counting address varied in response to a refresh command.

The address storage unit may include a random number generation unit suitable for generating a random number in response to the active command and a storage unit suitable for storing the input address in response to the active command if the random number generated from the random number generation unit is identical with a set value.

In another embodiment, an address storage circuit for storing an address inputted to a memory may include a period signal generation unit suitable for generating a period signal that oscillates in a set cycle, an enable signal generation unit suitable for activating an enable signal when an external signal is received from the outside of the memory by a first set number of times or more in the state in which the period signal is a first level and deactivating the enable signal when the external signal is received by a second set number of times or more in the state in which the period signal is a second level, and a storage unit suitable for storing an address corresponding to an active command when the active command is inputted to the memory in a state in which the enable signal is activated.

The enable signal generation unit may include a first signal generation unit suitable for generating a pre-enable signal in response to the period signal and the external signal and a second signal generation unit suitable for generating the enable signal by shifting the pre-enable signal in response to the external signal.

In a further embodiment, an address storage circuit for storing an address inputted to a memory may include a first counting information generation unit suitable for generating a first counting information by performing a counting operation in response to a first counting signal, a second counting information generation unit suitable for generating a second counting information by performing a counting operation in response to a second counting signal, and a storage unit suitable for storing an address corresponding to an active command when the active command is received if the first counting information and the second counting information have corresponding values, wherein each of the first counting signal and the second counting signal comprises one or more of the active command, a precharge command, a write command, a read command, a refresh command, an address, data, and a period signal that oscillates in a set cycle.

In another embodiment, a memory system may include a memory having a plurality of word lines to which one or more memory cells are coupled and an address storage unit for storing an input address corresponding to an active command at a random time and suitable for activating a word line corresponding to the input address of the plurality of word lines in response to the active command and refreshing one or more target word lines selected using an address stored in the address storage unit when performing a refresh operation, and a memory controller suitable for applying a plurality of control signals for controlling an operation of the memory, the control signals comprising the active command, a precharge command, a write command, a read command, a refresh command, the input address, and data.

DETAILED DESCRIPTION

Figure 1:
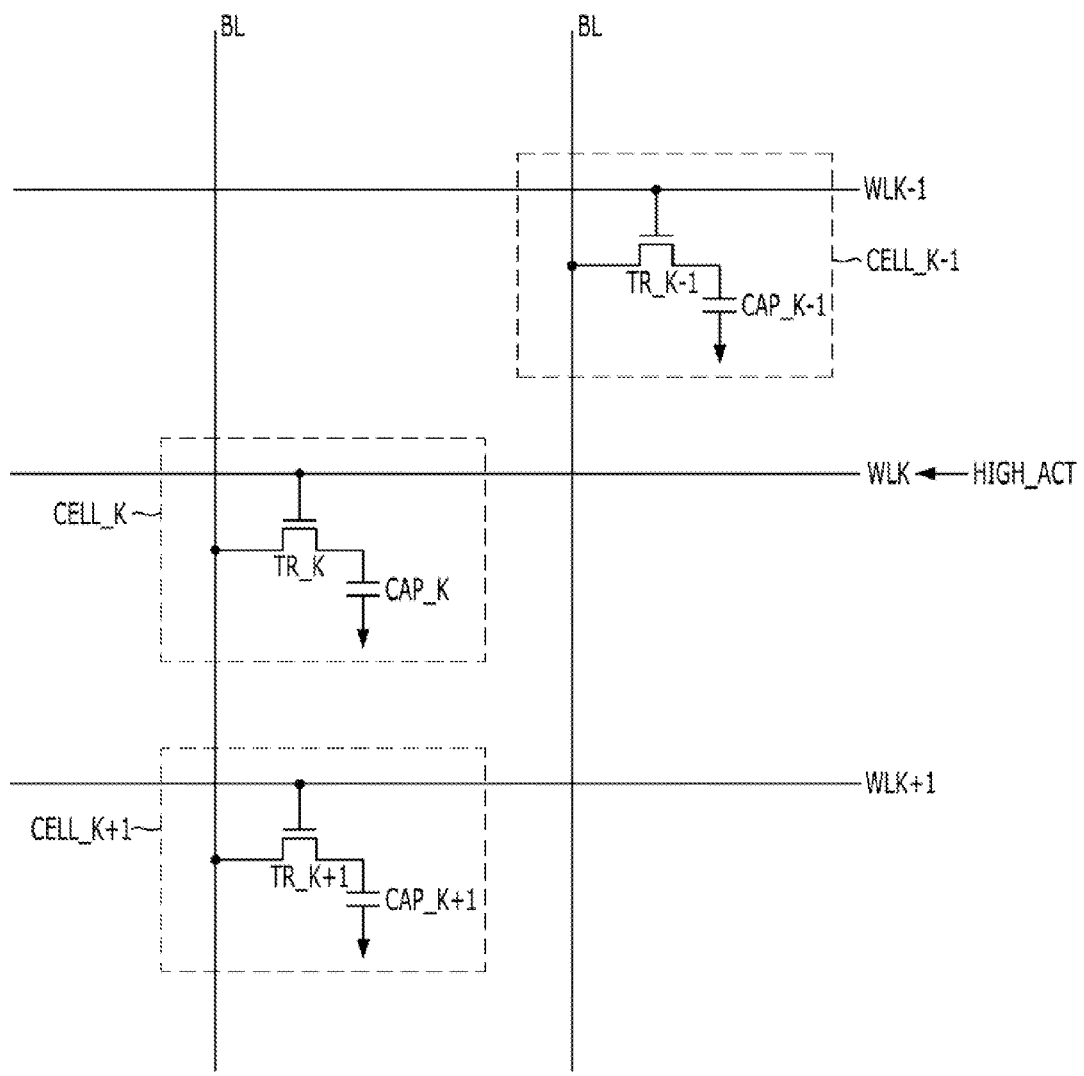
FIG. 1 is a diagram showing part of a cell array included in a memory in order to describe a word line disturbance phenomenon.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
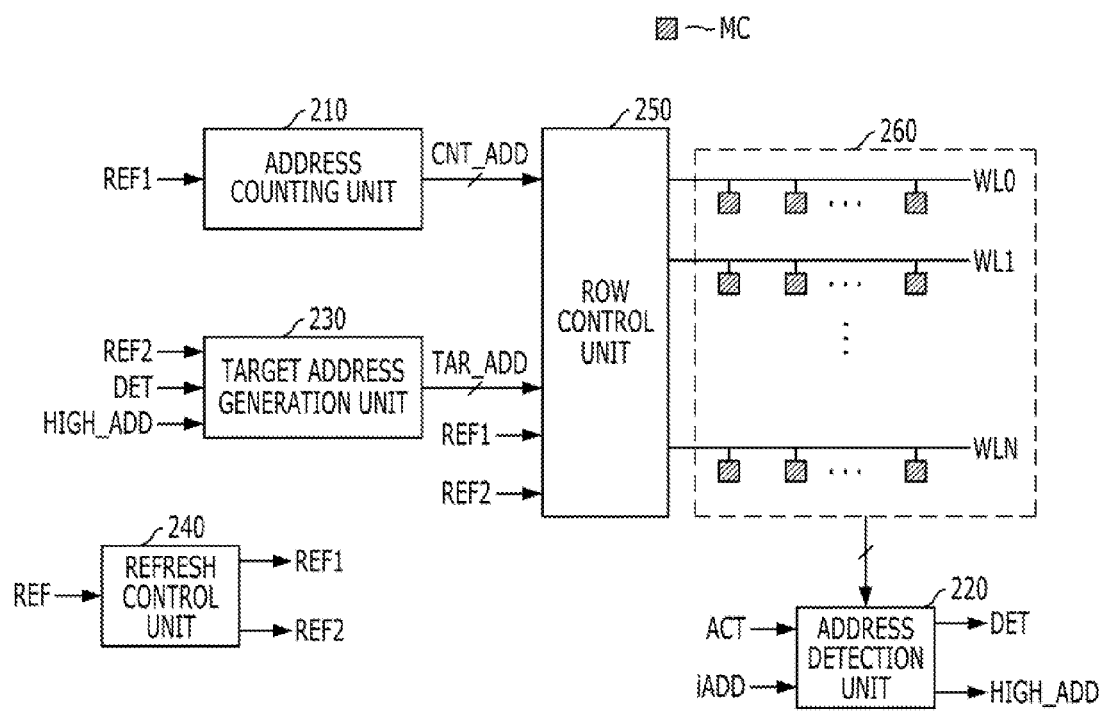
FIG. 2 is a diagram showing part of a memory in order to describe a target refresh operation.

FIG. 2 is a diagram showing part of a memory in order to describe a target refresh operation. Unlike a normal refresh operation of refreshing a plurality of word lines WL0 to WLN sequentially and repeatedly, a target refresh operation may indicate an operation of refreshing a specific one of a plurality of word lines. The aforementioned word line disturbance phenomenon may be prevented by such a target refresh operation.

As shown in FIG. 2, the memory may include an address counting unit 210, an address detection unit 220, a target address generation unit 230, a refresh control unit 240, a row control unit 250, and a cell array 260. The cell array 260 may include a plurality of word lines WL0 to WLN with each word line being coupled to one or more memory cells MC.

The refresh control unit 240 may activate a first refresh signal REF1 when a refresh command REF is received and may activate a second refresh signal REF2 whenever the refresh command REF is received a set number of times. For example, the refresh control unit 240 may activate the first refresh signal REF1 when the refresh command REF is received, count the number of times that the refresh command REF has been received, and activate the second refresh signal REF2 whenever the refresh command REF is received four times.

The address counting unit 210 generates a counting address CNT_ADD and may change a value of the counting address CNT_ADD whenever the first refresh signal REF1 is activated. For example, the address counting unit 210 may increase a value of the counting address CNT_ADD by 1 whenever the first refresh signal REF1 is activated. Increasing a value of the address by 1 means that the address is changed so that a $(K+1)^{th}$ word line WLK+1 is selected next if a $K^{th}$ word line WLK was previously selected.

The address detection unit 220 may detect a highly active word line by counting the number of times that each of the plurality of word lines WL0 to WLN has been activated or by referring to the active history of the memory, output an address HIGH_ADD (hereinafter referred to as a highly active address) of the highly active word line, and activate a detection signal DET. The highly active word line may indicate a word line that satisfies one or more conditions. The conditions may be that the number of activations is greater than or equal to a reference number and/or the condition may be that the frequency of activation is greater than or equal to a reference frequency. The address detection unit 220 may detect a highly active word line in response to an active command ACT and an input address iADD or it may detect a highly active word line based on Information about the activation of each word line received from the cell array 260. For reference, the active history may be information indicating which word line has been activated in each active operation of the memory.

The target address generation unit 230 may store a highly active address HIGH_ADD when the detection signal DET is activated and generate a target address TAR_ADD using the stored address when the second refresh signal REF2 is activated. The target address TAR_ADD is an address corresponding to a word line adjacent to a highly active word line. The target address TAR_ADD may have a value obtained by adding or subtracting 1 to or from the highly active address HIGH_ADD.

The row control unit 250 may refresh a word line corresponding to the counting address CNT_ADD when the first refresh signal REF1 is activated and may refresh a word line corresponding to the target address TAR_ADD when the second refresh signal REF2 is activated.

The memory sequentially refreshes the plurality of word lines WL0 to WLN (i.e., a normal refresh operation) when the refresh command REF is received, but may refresh a word line corresponding to the target address TAR_ADD (i.e., a target refresh operation) whenever the refresh command REF is received a set number of times. In order to detect a highly active word line, the address detection unit 220 has to count the number of times that each word line has been activated and store the counting value in the active history of the memory. To this end, counters corresponding to several thousands of word lines or more have to be used, or a circuit for storing addresses of activated word lines in the several thousands to several hundreds of thousands of active operations has to be used. That is, the size of a circuit necessary to detect a highly active word line needs to be large.

Figure 3:
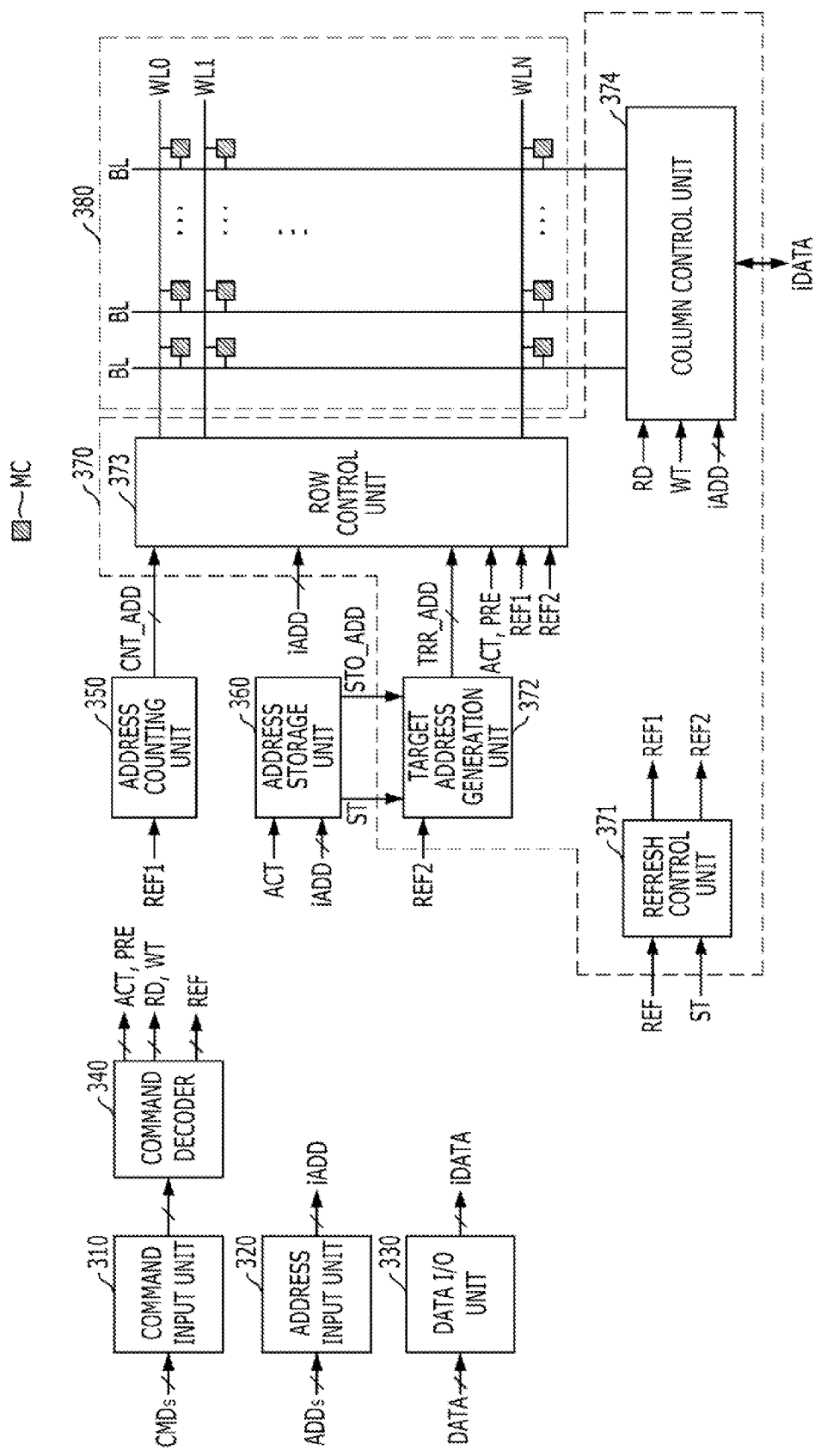
FIG. 3 is a diagram showing the construction of a memory according to an embodiment of the present invention.

FIG. 3 is a diagram showing the construction of a memory according to an embodiment of the present invention.

As shown in FIG. 3, the memory may include a command input unit 310, an address input unit 320, a data input/output (I/O) unit 330, a command decoder 340, an address counting unit 350, an address storage unit 360, a control unit 370, and a cell array 380. The cell array 380 may include a plurality of word lines WL0 to WLN, each coupled to one or more memory cells MC. The cell array 380 may further include a plurality of bit lines BL coupled to the one or more memory cells MC.

The memory is described below with reference to FIG. 3.

The command input unit 310 may receive command signals CMDs, and the address input unit 320 may receive addresses ADDs. The data I/O unit 330 may receive data DATA from outside of the memory and output data iDATA from within the memory. Each of the command signals CMDs, the addresses ADDs, and the data DATA may include signals of multiple bits.

The command decoder 340 may generate an active command ACT, a refresh command REF, a precharge command PRE, a write command WT, and a read command RD by decoding the command signals CMDs received from the command input unit 310. The command decoder 330 may activate a command that is indicated by a combination of received command signals CMDs among the active command ACT, the refresh command REF, the precharge command PRE, the write command WT, and the read command RD.

The address counting unit 350 may generate a counting address CNT_ADD having a value changed whenever the word lines WL0 to WLN are refreshed. The address counting unit 350 may increase a value of the counting address CNT_ADD by 1 whenever a first refresh signal REF1 is activated. The counting address CNT_ADD may be used as an address for selecting a word line to be refreshed in a normal refresh operation. Increasing the value of the counting address CNT_ADD by 1 means the counting address CNT_ADD is changed so that a $(K+1)^{th}$ word line WLK+1 is selected next if a $K^{th}$ word line WLK was previously selected.

The address storage unit 360 may store an input address iADD corresponding to the active command ACT at a random time. The input address iADD corresponding to the active command ACT may indicate an address of a word line that has already been activated in response to the active command ACT or an address of a word line to be activated in response to the active command ACT (hereinafter called an active word line). That is, the address storage unit 360 may store an address of an active word line at a random time. The address storage unit 360 may activate a storage signal ST when an address is stored and outputs the stored address STO_ADD.

When an address of an active word line is stored at a random time and a word line corresponding to the stored address and adjacent word lines are subject to a target refresh operation, the number of times that each of the word lines has been activated does not need to be counted. Accordingly, the size of the memory may be reduced due to the omission of counters, and the word line disturbance phenomenon may be prevented by a specific probability.

The control unit 370 may receive the commands ACT, PRE, REF, RD, and WT and the input address iADD and access the cell array 380. The control unit 370 may activate a word line corresponding to the input address iADD in response to the active command ACT. Among memory cells MC coupled to the activated word line, the control unit 370 may read data of memory cells MC corresponding to the input address iADD in response to the read command RD or may write data into the memory cells MC corresponding to the input address iADD in response to the write command WT. The control unit 370 may precharge the activated word line in response to the precharge command PRE. The control unit 370 may perform a normal refresh operation or a target refresh operation in response to the refresh command REF.

For such operations, the control unit 370 may include a refresh control unit 371, a target address generation unit 372, a row control unit 373, and a column control unit 374. The refresh control unit 371 may activate a first refresh signal REF1 in response to the refresh command REF for a normal refresh operation and may activate a second refresh signal REF2 in response to the refresh command REF for a target refresh operation.

When the refresh command REF is received a set number of times, the refresh control unit 371 may activate the second refresh signal REF2. In such a case, the memory may perform a target refresh operation whenever the refresh command REF is received a set number of times. For example, the memory may perform a target refresh operation by activating the second refresh signal REF2 whenever the refresh command REF is received four times. Alternatively, the refresh control unit 371 may activate the second refresh signal REF2 when the refresh command REF is received after an address is stored in the address storage unit 360 (i.e., when the storage signal ST is activated). In such a case, the memory may perform a target refresh operation when the refresh command REF is received after the storage signal ST is activated. In addition, the memory may perform a target refresh operation in various ways in response to the refresh command REF depending on the circuit design of the refresh control unit 371.

When the second refresh signal REF2 is activated, the target address generation unit 372 may generate a target address TAR_ADD using the address STO_ADD stored in the address storage unit 360. The target address TAR_ADD may be addresses of one or more target word lines to be refreshed in a target refresh operation. A target word line may be a word line corresponding to the address STO_ADD stored in the address storage unit 360 or may be a word line adjacent to a word line corresponding to the address STO_ADD stored in the address storage unit 360. The target address generation unit 372 may output the address STO_ADD stored in the address storage unit 360 as the target address TAR_ADD or may generate the target address TAR_ADD by adding or subtracting 1 to or from the address STO_ADD stored in the address storage unit 360.

The row control unit 373 may activate a word line corresponding to the input address iADD when the active command ACT is activated and may precharge the activated word line when the precharge command PRE is activated. The row control unit 373 may refresh a word line corresponding to the counting address CNT_ADD when the first refresh signal REF1 is activated and may refresh a word line corresponding to the target address TAR_ADD when the second refresh signal REF2 is activated.

The column control unit 374 may output data of memory cells MC corresponding to an input address iADD of memory cells MC coupled to an activated word line as internal data iDATA when the read command RD is activated and may input received internal data iDATA to the memory cells MC corresponding to the input address iADD of the memory cells MC coupled to the activated word line when the write command WT is activated. In a read operation, the column control unit 374 may convert parallel data received through bit lines BL corresponding to an input address iADD into serial data and output the serial data as internal data iDATA. In a write operation, the column control unit 374 may convert serially received internal data iDATA into parallel data and transfer the parallel data to bit lines BL corresponding to an input address iADD.

The memory may reduce the possibility that word line disturbance may occur and also minimize the size of the memory by storing an address of an active word line at a random time and performing a target refresh using the stored address. Furthermore, the memory may perform a target refresh operation internally in response to the refresh command REF.

Figure 4:
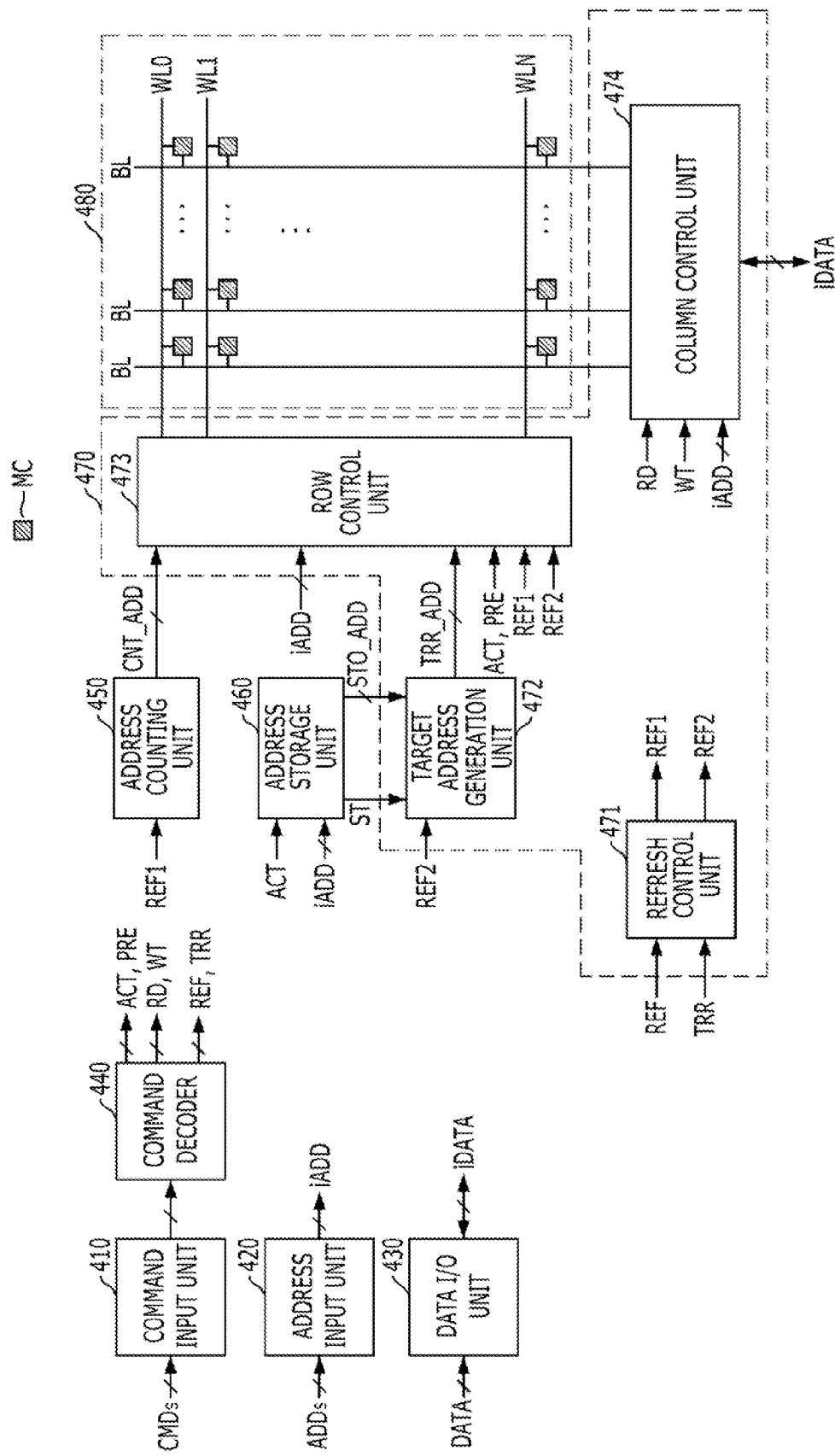
FIG. 4 is a diagram showing the construction of a memory according to another embodiment of the present invention.

FIG. 4 is a diagram showing the construction of a memory according to another embodiment of the present invention.

As shown in FIG. 4, the memory may include a command input unit 410, an address input unit 420, a data I/O unit 430, a command decoder 440, an address counting unit 450, an address storage unit 460, a control unit 470, and a cell array 480. The cell array 480 may include a plurality of word lines WL0 to WLN, each of which are coupled to one or more memory cells MC. The cell array 480 may further include a plurality of bit lines BL to which the one or more memory cells MC are coupled.

Unlike the memory of FIG. 3, the memory of FIG. 4 may perform a target refresh operation in response to an external command. The memory of FIG. 4 is described below based on differences between the memory of FIG. 4 and the memory of FIG. 3.

The command decoder 440 may activate a target refresh command TRR in addition to the commands ACT, PRE, REF, WT, and RD described with reference to FIG. 3 if command signals CMDs received through the command input unit 410 indicate the target refresh command TRR. Here, the target refresh command TRR may be a newly defined command. The target refresh command TRR may be periodically transmitted from an external device (e.g., a memory controller) for controlling the memory to the memory or may be inputted to the memory when a storage signal ST is outputted through the data I/O unit 430 and transferred to the external device after an address is stored in the address storage unit 460.

A refresh control unit 471 may activate a first refresh signal REF1 in response to the refresh command REF and may activate a second refresh signal REF2 in response to the target refresh command TRR.

In such a case, the memory sequentially refreshes a plurality of word lines WL0 to WLN (i.e., normal refresh operation) in response to the refresh command REF that is periodically received, but may perform a target refresh operation in response to the target refresh command TRR. The other elements and operations of the memory are the same as those of FIG. 3.

Like the memory of FIG. 3, the memory of FIG. 4 may reduce the possibility that word line disturbance may occur and also minimize the size of the memory by storing an address of an active word line at a random time and performing a target refresh operation using the stored address. Furthermore, the memory may perform a target refresh operation in response to an external command.

Figure 5:
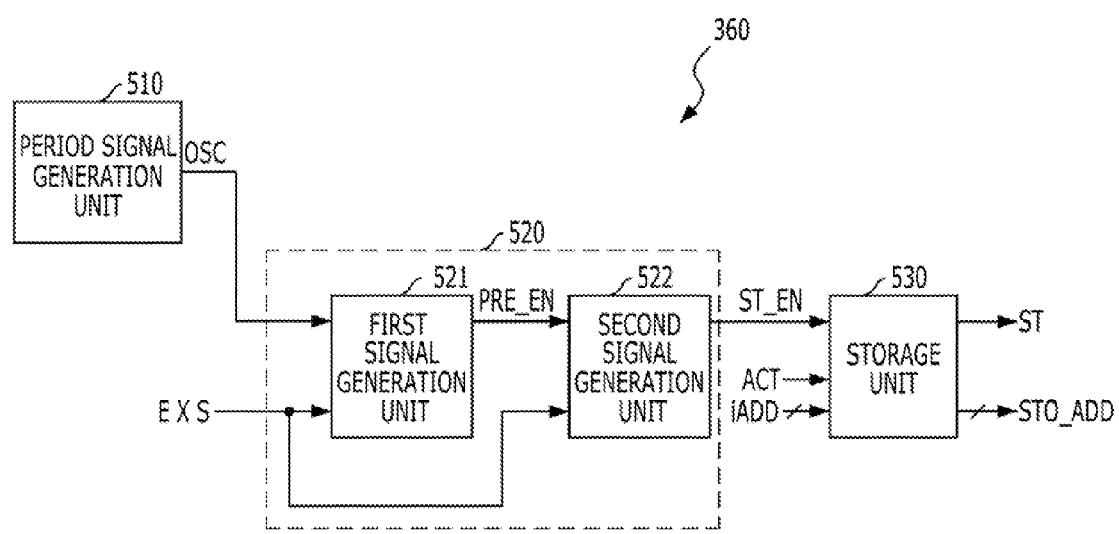
FIG. 5 is a diagram showing the construction of an address storage unit 360 according to an embodiment of the present invention.

FIG. 5 is a diagram showing the construction of the address storage unit 360 according to an embodiment of the present invention.

As shown in FIG. 5, the address storage unit 360 may include a period signal generation unit 510, an enable signal generation unit 520, and a storage unit 530. The address storage unit 360 of FIG. 5 may determine a time at which the input address iADD is stored using a period signal OSC that oscillates in a set cycle and an external signal received from the outside of the memory.

The address storage unit 360 is described below with reference to FIG. 5.

The period signal generation unit 510 may generate a period signal OSC that oscillates in a set cycle. The period of the period signal OSC may be set at various values (e.g., from several ns to several hundreds μs) depending on the circuit design. The frequency in which the address storage unit 360 stores the address iADD may be controlled depending on the period of the period signal OSC. That is, the frequency in which the address storage unit 360 stores the address iADD may be increased as the period of the period signal OSC is reduced, and may be decreased as the period of the period signal OSC is increased. The period signal generation unit 510 may be an oscillator for generating an oscillating signal.

The enable signal generation unit 520 may activate an enable signal ST_EN when an external signal EXS is received by a first set number of times or more in the state in which the period signal OSC is a first level (e.g., 'High') and may deactivate the enable signal ST_EN when the external signal EXS is received by a second set number of times or more in the state in which the period signal OSC is a second level (e.g., 'Low'). The first set number of times and the second set number of times may be the same. For such an operation, the enable signal generation unit 520 may include a first signal generation unit 521 for generating a pre-enable signal PRE_EN using the period signal OSC and the external signal EXS and a second signal generation unit 522 for generating the enable signal ST_EN by shifting the pre-enable signal PRE_EN when the external signal EXS is received.

The first signal generation unit 521 may activate the pre-enable signal PRE_EN when the external signal EXS is received in the state in which the period signal OSC is the first level and may deactivate the pre-enable signal PRE_EN when the external signal EXS is received in the state in which the period signal OSC is the second level. The second signal generation unit 522 shifts the pre-enable signal PRE_EN whenever the external signal EXS is received. When the external signal EXS is received by the first set number of times in the state in which the period signal OSC is the first level, the second signal generation unit 522 may activate the enable signal ST_EN by transferring the activated pre-enable signal PRE_EN as the enable signal ST_EN. When the external signal EXS is received by the second set number of times in the state in which the period signal OSC is the second level, the second signal generation unit 522 may deactivate the enable signal ST_EN by transferring the deactivated pre-enable signal PRE_EN as the enable signal ST_EN.

When the active command ACT is inputted to the memory in the state in which the enable signal ST_EN has been activated, the storage unit 530 may store an address iADD corresponding to the active command ACT. Here, the storage unit 530 may store all addresses iADD received whenever the active command ACT is activated in the state in which the enable signal ST_EN has been activated or store some of the addresses iADD. For example, if the storage unit 530 is able to store only one address, the storage unit 530 may store an address iADD only when the active command ACT is first activated in the state in which the enable signal ST_EN has been activated, without storing a subsequent address, or may store only an address iADD corresponding to the active command ACT that is finally received in the state in which the enable signal ST_EN has been activated by updating a previously stored address into a currently received address iADD. When an address is stored, the storage unit 530 may activate the storage signal ST and output a stored address STO_ADD.

Here, the external signal EXS is received from an external device (e.g., a memory controller or test equipment) for controlling the memory. When the external signal EXS is inputted to the memory, the frequency which the external signal EXS is inputted to the memory and a pulse width of the external signal EXS may not be related to the period of the period signal OSC. The external signal EXS may include one or more of the active command ACT, the precharge command PRE, the write command WT, the read command RD, the refresh command REF, the addresses ADDs, and data DATA. The memory may perform an operation using the commands CMDs, the addresses ADDs, and the data DATA irrespective of the period signal OSC.

That is, the period of the period signal OSC is not related to the time or frequency that the external signal EXS is applied. Furthermore, since the period, the point in time, and frequency may not be predicted when seen externally, an address of an active word may be stored at a random time by storing the address when the period signal OSC and the external signal EXS meet on a set condition.

Figure 6:
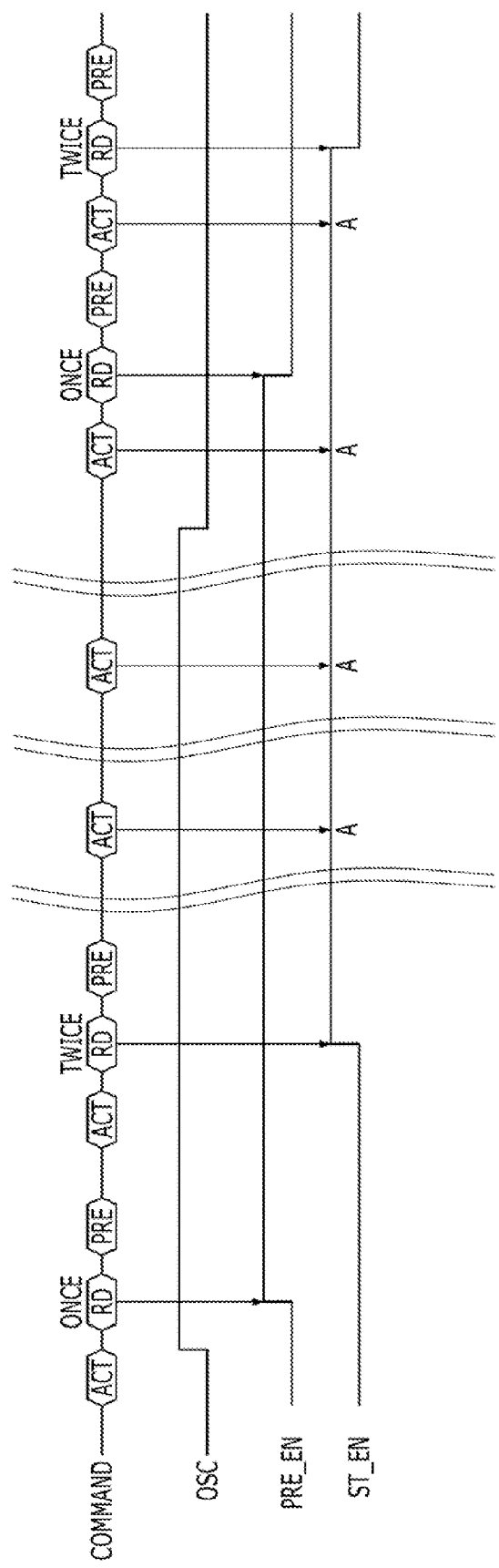
FIG. 6 shows a waveform illustrating the operation of the address storage unit 360 of FIG. 5.

FIG. 6 shows a waveform illustrating the operation of the address storage unit 360 of FIG. 5. In FIG. 6, the external signal EXS is a read command RD and a first set number and a second set number are 2.

First, after the period signal OSC shifts to a high level, commands ACT, RD, and PRE are received for a read operation. When the read command RD is received in the state in which the period signal OSC is a high level, the pre-enable signal PRE_EN is activated. When the read command RD is received twice, the enable signal ST_EN is activated. When the active command ACT is received in the state in which the enable signal ST_EN has been activated, an address iADD is stored (A). When the read command RD is received after the period signal OSC shifts to a low level, the pre-enable signal PRE_EN is deactivated. When the read command RD is received twice, the enable signal ST_EN is deactivated.

FIG. 6 illustrates only parts where the read command RD is met several times with the high or low level of the period signal OSC in order to describe a situation in which an address is stored. However, when the memory operates the enable signal ST_EN is activated and deactivated at unpredictable times because the read command RD is applied irrespective of the period signal OSC.

FIG. 5 illustrates a case where the address storage unit 360 internally generates the period signal OSC, but the period signal OSC may be received from outside the memory. Here, the period signal OSC may not be related to when other external signals are inputted or the frequency in which other external signals are inputted. FIG. 6 illustrates a case where the external signal EXS is the read command RD. However, as described above, the external signal EXS may be 1 bit of another command (e.g., ACT, PRE, REF, or WT), the addresses ADDs, and the data DATA and may be a signal obtained by delaying the above signals by a specific value. The address storage unit 360 may store an address of an active word line at a random time by combining the signals that are not related to each other as described above, but storing the address in response to the active command ACT.

In FIGS. 5 and 6, an example in which the enable signal ST_EN is activated when a specific external signal (e.g., a read command RD) is activated a specific number of times (e.g., twice) has been illustrated. However, the number of external signals that need to be inputted in order for the enable signal ST_EN to be activated may be changed depending on the circuit design. For example, the enable signal ST_EN may be activated when the write command WT is activated three times after the precharge command PRE is activated twice.

Figure 7:
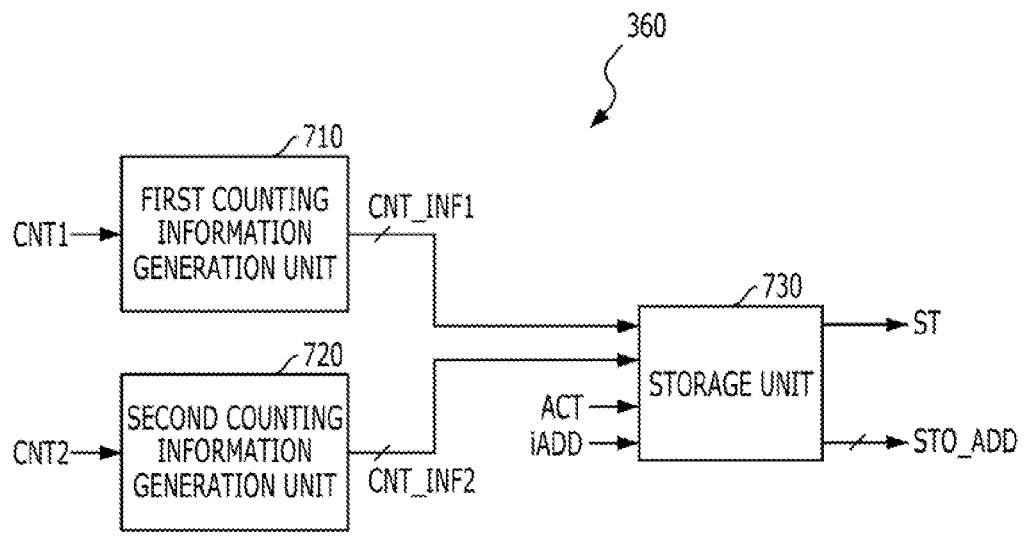
FIG. 7 is a diagram showing the construction of an address storage unit 360 according to another embodiment of the present invention.

FIG. 7 is a diagram showing the construction of the address storage unit 360 according to another embodiment of the present invention.

As shown in FIG. 7, the address storage unit 360 may include a first counting information generation unit 710, a second counting information generation unit 720, and a storage unit 730. The address storage unit 360 of FIG. 7 may determine a time at which the input address iADD is stored using a value obtained by counting two signals that are not related to each other.

The address storage unit 360 is described below with reference to FIG. 7.

The first counting information generation unit 710 may perform counting in response to a first counting signal CNT1 and generate first counting information CNT_INF1 corresponding to a result of the counting. The first counting information generation unit 710 may make the first counting information CNT_INF1 have an offset value or make some of a plurality of bits of the first counting information CNT_INF1 have a fixed value. If the first counting information CNT_INF1 reaches a set value, the first counting information generation unit 710 may reset the first counting information CNT_INF1 to an initial value and count the first counting signal CNT1 from the beginning. For example, when the first counting information CNT_INF1 is a signal of 7 bits and is increased by 1 whenever the first counting signal CNT1 is activated, the first counting information CNT_INF1 may have an offset value by setting an initial value as '0001000', not '0000000'. Furthermore, some bits of the first counting information CNT_INF1 have a fixed value and the remaining bits may be changed. For example, when the first counting information CNT_INF1 is a signal of 7 bits and the third bit of the 7 bits is fixed to a value '1', the remaining bits are changed through counting such as '00 10000', '0010001', '0010010', . . . ) the underlined bit is always '1', and the remaining bits are changed by counting).

The second counting information generation unit 720 may perform counting in response to a second counting signal CNT2 and generate second counting information CNT_INF2 corresponding to the result. When the address iADD is stored in the storage unit 730 (i.e., the storage signal ST is activated), the second counting information generation unit 720 may reset a value of the second counting information CNT_INF2 to an initial value and count the second counting signal CNT2 from the beginning. For reference, to count a specific signal may indicate an operation of counting the number of times that signal is activated (or deactivated).

The storage unit 730 receives the first counting information CNT_INF1 and the second counting information CNT_INF2. When the first and second counting information CNT_RNF1 and CNT_INF2 has corresponding values and the active command ACT is received, the storage unit 730 may store an address iADD corresponding to the active command ACT. When an address is stored, the storage unit 730 may activate the storage signal ST and output a stored address STO_ADD. A case where the first counting information CNT_INF1 and the second counting information CNT_INF2 have corresponding values may refer to a case where they have values having a specific relation according to a set rule. For example, all bits of the first counting information CNT_INF1 and the second counting information CNT_INF2 may have the same value, or some of or all the bits of the first counting information CNT_INF1 may have the same value as some of or all the bits of the second counting information CNT_INF2, respectively.

The counting signals CNT1 and CNT2 may include different signals that belong to the active command ACT, the precharge command PRE, the write command WT, the read command RD, the refresh command REF, the address ADDs, the data DATA, and a period signal having a set period. If the counting signal CNT1, CNT2 is the address ADDs or the data DATA, the counting signal CNT1, CNT2 may be one of a plurality of bits included in the address ADDs and the data DATA.

For example, the first counting signal CNT1 may be the refresh command REF (or the first refresh signal REF1), and the second counting signal CNT2 may be the active command ACT. In such a case, the first counting information CNT_INF1 may be generated using the address counting unit 350. The second counting signal generation unit 720 may generate the second counting information CNT_INF2 by performing counting whenever the active command ACT is activated.

It is hereinafter described as an example that the first counting signal CNT1 is the first refresh signal REF1, the second counting signal CNT2 is the active signal ACT, each of the counting signals CNT1 and CNT2 is a signal of 9 bits, the fifth bit of the first counting information CNT_INF1 is fixed to '1', the first counting information CNT_INF1 is initialized when all bits become '1', and the address storage unit 360 stores an address when all bits of the first counting information CNT_INF1 are the same as the respective bits of the second counting information CNT_INF2.

When the active command ACT is received 32 times in the state in which the first counting information CNT_INF1 is '000010000', the address storage unit 360 may store an address because the second counting information CNT_INF2 is '000010000'. Thereafter, the second counting information CNT_INF2 may be reset to '000000000'. It is described as an example that while the active command ACT is received, the first refresh signal REF1 is activated three times and the first counting information CNT_INF1 becomes '0000010011'. In such a case, the address storage unit 360 may store an address when the active command ACT is received 35 times from when an address was previously stored. If the first counting information CNT_INF1 is '111111111', only when the active command ACT is received 1023 times, an address is stored. Thereafter, when the first refresh signal REF1 is activated, the first counting information CNT_INF1 may be reset to '000010000'. As described above, since a value of the first counting information CNT_INF1 continues to be changed while a value of the second counting information CNT2 is increased, the frequency in which the address storage unit 360 stores an address continues to be changed. Accordingly, the memory may store an address of an active word line at a random time that may not be predicted externally.

Although the second counting signal CNT2 is a period signal, the frequency in which an address is stored may continue to be changed by performing counting whenever the period signal has a specific level and storing an address when the first counting information CNT_INF1 and the second counting information CNT_INF2 have corresponding values. That is, an address may be stored at a random time or a time that may not be predicted externally. Here, the frequency in which the address storage unit 360 stores an address may be increased as the interval in which the second counting signal CNT2 is activated becomes narrow, and the frequency in which the address storage unit 360 stores an address may be decreased as the Interval in which the second counting signal CNT2 is activated becomes wide.

Figure 8:
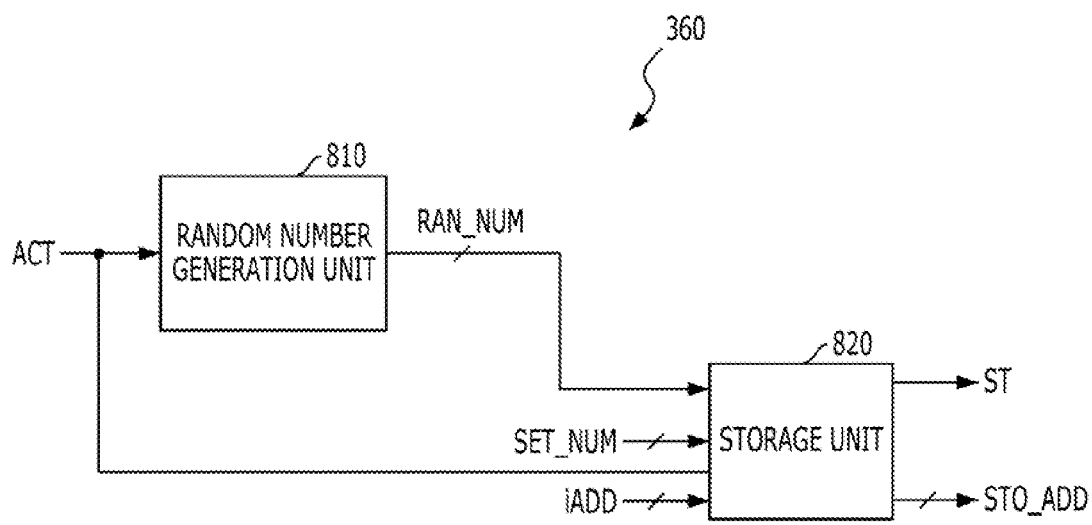
FIG. 8 is a diagram showing the construction of an address storage unit 360 according to yet another embodiment of the present invention.

FIG. 8 is a diagram showing the construction of the address storage unit 360 according to yet another embodiment of the present invention.

As shown in FIG. 8, the address storage unit 360 may include a random number generation unit 810 and a storage unit 820. The random number generation unit 810 may be a random number generation circuit that generates a random number RAN_NUM when the active command ACT is activated. The random number generation circuit may randomly generate one of a set number of integers. Here, random numbers may not be periodically generated, but may be independently generated from previously generated random numbers.

If a random number RAN_NUM generated from the random number generation unit 810 is identical with a set value SET_NUM, the storage unit 820 may store an input address iADD in response to the active command ACT. When an address is stored, the storage unit 820 may activate the storage signal ST and output the stored address STO_ADD. Since the random number RAN_NUM generated from the random number generation unit 810 has a random value, a time at which the random number RAN_NUM becomes identical with the set value SET_NUM may also be random. Accordingly, the memory may store an address of an active word line at a random time that cannot be predicted externally. Here, the frequency in which the address storage unit 360 stores an address may be increased as the random number RAN_NUM to be generated is decreased, and the frequency in which the address storage unit 360 stores an address may be decreased as the random number RAN_NUM to be generated is increased.

Figure 9:
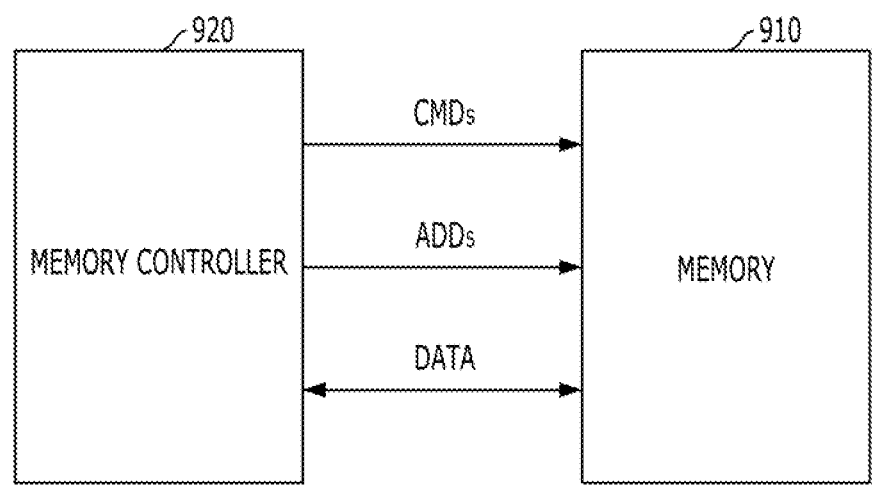
FIG. 9 is a diagram showing the construction of a memory system according to an embodiment of the present invention.

FIG. 9 is a diagram showing the construction of a memory system according to an embodiment of the present invention.

As shown in FIG. 9, the memory system may include a memory 910 and a memory controller 920.

The memory controller 920 controls an operation of the memory 910 by applying the command signals CMDs and the addresses ADDs to the memory 910 and exchanges data DATA with the memory 910 in read and write operations. The memory controller 920 may input the active command ACT, the precharge command PRE, the read command RD, the write command WT, or the refresh command REF to the memory 910 by sending command signals CMDs to the memory 910. If the active command ACT is sought to be inputted to the memory 910, the memory controller 920 may send the addresses ADDs for selecting a cell block and a word line to be activated in the memory 910. The memory controller 920 may periodically send the refresh command REF to the memory 910.

The memory 910 may be one described in reference to FIG. 3 or FIG. 4. If the memory 910 is the memory of FIG. 3, the memory 910 may store an address of a word line corresponding to the active command ACT at a random time and may perform a target refresh operation in response to the refresh command REF. If the memory 910 is the memory of FIG. 4, the memory 910 may store an address of a word line corresponding to the active command ACT at a random time and may perform a target refresh operation in response to the target refresh command TRR. In the latter case, the memory 910 may transfer information, indicating that an address has been stored in the address storage unit 460, to the memory controller 920 through the data I/O unit 430 so that the memory controller 920 may apply the target refresh command TRR to the memory 910.

The memory of FIG. 3 performs a normal refresh operation in response to the refresh command REF, but may perform a target refresh operation using an address stored in the address storage unit 360 when the refresh command REF is received a set number of times or when the refresh command REF is received after the address is stored in the address storage unit 360. For reference, the construction and operation that are necessary for the memory 910 to perform the above refresh operations is the same as described with reference to FIGS. 3 to 7.

The memory system may reduce the possibility that word line disturbance may occur by storing an address of an active word line and performing a target refresh operation. Here, the size of the memory 910 may be reduced because an element for detecting a highly active word line is not necessary.

In accordance with this technology, an address of an activated word line is stored at a random time and word lines adjacent to a word line corresponding to the stored address are refreshed. Accordingly, loss of data stored in memory cells coupled to such word lines may be prevented.

Furthermore, data stored in memory cells coupled to word lines adjacent to highly active word lines (having a large number of activations or high activation frequency) may be prevented from being lost due to word line disturbance.

Although various embodiments have been described for illustrative purposes, it will be apparent to those skilled in the art that various changes and modifications may be made without departing from the spirit and scope of the invention as defined in the following claims.

What is claimed is:

1. A memory, comprising:
   a plurality of word lines wherein one or more memory cells are coupled to individual word lines;
   an address storage unit configured to store an input address at a random time, wherein the input address corresponding to an active command at random time;
   a target address generation unit configured to generate a target address by adding or subtracting a set value to or from an address stored in the address storage unit; and
   a control unit configured to activate a word line corresponding to the input address of the plurality of word lines in response to an active command and refreshing one or more target word lines corresponding to the target address when performing a refresh operation,
   wherein the one or more target word lines comprise one or more word lines adjacent to the word line corresponding to the address stored in the address storage unit.

2. The memory of claim 1, wherein:
   the address storage unit determines a time at which the input address is stored using a period signal that oscillates in a set cycle and an external signal that is externally received.

3. The memory of claim 2, wherein the address storage unit comprises:
   an enable signal generation unit configured to activate an enable signal when the external signal is received by a first set number of times or more in a state in which the period signal is a first level, and deactivating the enable signal when the external signal is received by a second set number of times or more in a state in which the period signal is a second level; and
   a storage unit configured to store the input address when the active command is received if the enable signal is activated.

4. The memory of claim 2, wherein the external signal comprises one or more of the active command, a precharge command, a write command, a read command, a refresh command, the input address, and data.

5. The memory of claim 1, wherein:
   the address storage unit determines a time at which the input address is stored, using first and second counting signals,
   wherein the first and second counting signals comprise one or more of the active command, a precharge command, a write command, a read command, a refresh command, the input address, data, and a period signal oscillating in a set cycle.

6. The memory of claim 5, wherein the address storage unit comprises:
   a first counting information generation unit configured to generate a first counting information by counting the first counting signal;
   a second counting information generation unit configured to generate a second counting information by counting the second counting signal; and
   a storage unit configured to store the input address when the active command is received if the first counting information and the second counting information have corresponding values.

7. The memory of claim 5, wherein the first counting information has an offset value or includes a plurality of bits, a part of which is fixed, and the second counting information is reset to an initial value when the input address is stored.

8. The memory of claim 5, further comprising:
   an address counting unit configured to generate a counting address varied in response to the refresh command,
   wherein the address storage unit generates a counting information in response to the active command and stores the input address when the active command is received if the counting address and the counting information have corresponding values; and the control unit refreshes a word line corresponding to the counting address in response to the refresh command.

9. The memory of claim 1, wherein the address storage unit comprises:
   a random number generation unit configured to generate a random number in response to the active command; and
   a storage unit configured to store the input address in response to the active command if the random number generated from the random number generation unit is identical with a set value.

10. The memory of claim 1, wherein the control unit generates addresses of one or more word lines adjacent to a word line corresponding to the address stored in the address storage unit.

11. The memory of claim 1, wherein the control unit sequentially refreshes the plurality of word lines in response to a refresh command that is periodically received, but refreshes the one or more target word lines when the refresh command is received a set number of times.

12. The memory of claim 1, wherein the control unit sequentially refreshes the plurality of word lines in response to a refresh command that is periodically received, but refreshes the one or more target word lines when the refresh command is received after the input address is stored in the address storage unit.

13. The memory of claim 1, wherein the control unit sequentially refreshes the plurality of word lines in response to a refresh command that is periodically received, but refreshes the one or more target word lines when a target refresh command is received.

14. An address storage circuit for storing an address inputted to a memory, comprising:
a period signal generation unit configured to generate a period signal that oscillates in a set cycle;
an enable signal generation unit configured to activate an enable signal, when ml external signal is received from an outside of the memory by a first set number of times or more in a state in which the period signal is a first level, and deactivating the enable signal, when the external signal is received by a second set number of times or more in a state in which the period signal is a second level; and
a storage unit configured to store an address corresponding to an active command when the active command is inputted to the memory in a state in which the enable signal is activated wherein the enable signal generation unit comprises:
a first signal generation unit configured to generate a pre-enable signal in response to the period signal and the external signal; and
a second signal generation unit configured to generate the enable signal by shifting the pre-enable signal in response to the external signal.

15. The address storage circuit of claim 14, wherein the external signal comprises one or more of the active command, a precharge command, a write command, a read command, a refresh command, the address, and data.

16. The address storage circuit of claim 14, wherein the period signal generation unit comprises an oscillator.

17. An address storage circuit for storing an address inputted to a memory, comprising:
a first counting information generation unit configured to generate a first counting information by performing a counting operation in response to a first counting signal;
a second counting information generation unit configured to generate a second counting information by performing a counting operation in response to a second counting signal; and
a storage unit configured to store an address corresponding to an active command when the active command is received if the first counting information and the second counting information have corresponding values,
wherein each of the first counting signal and the second counting signal comprise one or more of the active command, a precharge command, a write command, a read command, a refresh command, an address, data, and a period signal that oscillates in a set cycle.

18. The address storage circuit of claim 17, wherein the first counting information generation unit makes the first counting info nation have an offset value or makes a part of a plurality of bits of the first counting information have a fixed value.

19. The address storage circuit of claim 17, wherein:
the first counting information generation unit resets the first counting information to an initial value when the first counting information has a set value; and
the second counting information generation unit resets the second counting information to an initial value when the input address is stored.

20. The address storage circuit of claim 17, wherein:
the first counting signal is the refresh command; and
the second counting signal is the active command.

21. A memory system, comprising:
a memory having a plurality of word lines to which one or more memory cells are coupled an address storage unit for storing an input address corresponding to an active command at a random time and a target address generation unit configured to generate a target address by adding or subtracting a set value to or from an address stored in the address storage unit, and configured to activate a word line corresponding to the input address of the plurality of word lines in response to the active command and refreshing one or more target word lines corresponding to the target address when performing a refresh operation,
wherein the one or more target word lines comprise one or more word lines adjacent to the word line corresponding to the address stored in the address storage unit; and
a memory controller configured to apply a plurality of control signals for controlling an operation of the memory, the control signals comprising the active command, a precharge command, a write command, a read command, a refresh command, the input address, and data.

22. The memory system of claim 21, wherein the address storage unit determines a point of time, at which the input address is stored, using one or more of a period signal that oscillates in a set cycle and the plurality of control signals received from the memory controller.

23. The memory system of claim 21, wherein the address storage unit stores the input address when the active command is received if a first counting information and a second counting information have corresponding values,
wherein the first counting information corresponding to a result of a counting operation performed in response to a first counting signal, comprising one or more of the plurality of control signals and a first period signal that oscillates in a first set cycle, and
wherein the second counting information corresponding to a result of a counting operation performed in response to a second counting signal, comprising one or more of the plurality of control signals and a second period signal that oscillates in a second set cycle.

24. The memory system of claim 21, wherein the memory sequentially refreshes the plurality of word lines in response to the refresh command that is periodically received, but refreshes the one or more target word lines when the refresh command is received by a set number of times.

25. The memory system of claim 21, wherein the memory sequentially refreshes the plurality of word lines in response to the refresh command that is periodically received, but refreshes the one or more target word lines when the refresh command is received after the address is stored in the address storage unit.

26. The memory system of claim 21, wherein:
the memory controller inputs a target refresh command to the memory; and
the memory sequentially refreshes the plurality of word lines in response to the refresh command that is periodically received, but refreshes the one or more target word lines in response to the target refresh command.

27. The memory system of claim 21, wherein the one or more target word lines comprise one or more word lines corresponding to the address stored in the address storage unit and one or more word lines adjacent to the word line corresponding to the address stored in the address storage unit.

\* \* \* \* \*